US010217674B1

(12) United States Patent
Hook et al.

(10) Patent No.: US 10,217,674 B1
(45) Date of Patent: Feb. 26, 2019

(54) THREE-DIMENSIONAL MONOLITHIC VERTICAL FIELD EFFECT TRANSISTOR LOGIC GATES

(71) Applicant: International Business Machines Corporation, Armonk, NY (US)

(72) Inventors: Terry Hook, Jericho, VT (US); Ardasheir Rahman, Schenectady, NY (US); Joshua Rubin, Albany, NY (US); Chen Zhang, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/840,897

(22) Filed: Dec. 13, 2017

(51) Int. Cl.
*H01L 29/66* (2006.01)
*H01L 21/84* (2006.01)
*H01L 23/00* (2006.01)
*H01L 27/12* (2006.01)
*H01L 23/528* (2006.01)
(Continued)

(52) U.S. Cl.
CPC ........ *H01L 21/84* (2013.01); *H01L 21/76802* (2013.01); *H01L 21/76877* (2013.01); *H01L 23/5226* (2013.01); *H01L 23/5286* (2013.01); *H01L 24/29* (2013.01); *H01L 24/32* (2013.01); *H01L 24/83* (2013.01); *H01L 27/1203* (2013.01); *H01L 2224/29186* (2013.01); *H01L 2224/32145* (2013.01); *H01L 2224/83896* (2013.01)

(58) Field of Classification Search
CPC ............. H01L 29/7813; H01L 29/7802; H01L 29/7827; H01L 29/66666; H01L 29/696; H01L 27/0688; H01L 21/8221; H01L 27/105; H01L 27/11

USPC ......... 257/329, 328, 278, 326; 438/212, 268
See application file for complete search history.

(56) References Cited

U.S. PATENT DOCUMENTS

| 5,612,563 A | 3/1997 | Fitch et al. |
|---|---|---|
| 6,424,007 B1 | 7/2002 | Disney |
| 6,744,082 B1 | 6/2004 | Forbes et al. |

(Continued)

OTHER PUBLICATIONS

List of IBM Patents or Applications Treated as Related.
(Continued)

*Primary Examiner* — Thinh T Nguyen
(74) *Attorney, Agent, or Firm* — Amin, Turocy & Watson, LLP

(57) ABSTRACT

Techniques facilitating three-dimensional monolithic vertical field effect transistor logic gates are provided. A logic device can comprise a first vertical transport field effect transistor formed over and adjacent a substrate and a first bonding film deposited over the first vertical transport field effect transistor. The logic device can also comprise a second vertical transport field effect transistor comprising a second bonding film and stacked on the first vertical transport field effect transistor. The second bonding film can affix the second vertical transport field effect transistor to the first vertical transport field effect transistor. In addition, the logic device can comprise one or more monolithic inter-layer vias that extend from first respective portions of the second vertical transport field effect transistor to second respective portions of the first vertical transport field effect transistor and through the first bonding film and the second bonding film.

9 Claims, 17 Drawing Sheets

(51) Int. Cl.
*H01L 21/768* (2006.01)
*H01L 23/522* (2006.01)

(56) References Cited

U.S. PATENT DOCUMENTS

| | | |
|---|---|---|
| 7,098,478 B2 | 8/2006 | Takaura et al. |
| 7,109,544 B2 | 9/2006 | Schloesser et al. |
| 7,683,428 B2 | 3/2010 | Chidambarrao et al. |
| 7,709,827 B2 | 5/2010 | Graham et al. |
| 8,637,849 B2 | 1/2014 | Deligianni et al. |
| 9,177,890 B2 | 11/2015 | Du |
| 9,659,963 B2 | 5/2017 | Cheng et al. |
| 9,680,473 B1 | 6/2017 | Anderson et al. |
| 9,685,436 B2 | 6/2017 | Morrow et al. |
| 2002/0140006 A1 | 10/2002 | Mimino et al. |
| 2004/0085810 A1 | 5/2004 | Hoenigschmid et al. |
| 2006/0128088 A1 | 6/2006 | Graham et al. |
| 2006/0261406 A1 | 11/2006 | Chen |
| 2009/0236658 A1 | 9/2009 | Gruening-von Schwerin |
| 2010/0190334 A1 | 7/2010 | Lee |
| 2011/0108803 A1 | 5/2011 | Deligianni et al. |
| 2013/0001701 A1* | 1/2013 | Christensen .......... H01L 21/743 257/369 |
| 2014/0252306 A1 | 9/2014 | Du |
| 2014/0340952 A1* | 11/2014 | Ramaswamy ........ G11C 11/221 365/51 |
| 2015/0143309 A1 | 5/2015 | De Dood et al. |
| 2016/0043074 A1 | 2/2016 | Hurley et al. |
| 2017/0025412 A1 | 1/2017 | Jun et al. |
| 2018/0138200 A1 | 5/2018 | Kim et al. |
| 2018/0166433 A1 | 6/2018 | Fujiwara et al. |

OTHER PUBLICATIONS

Veloso et al., "Junctionless Gate-All-Around Lateral and Vertical Nanowire FETs with Simplified Processing for Advanced Logic and Analog/RF Applications and Scaled SRAM Cells," Symposium on VLSI Technology Digest of Technical Papers, 2016, IEEE, 2 pages.
Office Action dated Oct. 4, 2018 for U.S. Appl. No. 15/840,878, 87 pages.

* cited by examiner

THREE-DIMENSIONAL MONOLITHIC VERTICAL FIELD EFFECT TRANSISTOR LOGIC GATES

BACKGROUND

The subject disclosure relates to semiconductor device structures and assembly, and more specifically, to vertical transistor devices and methods for making vertical transistor devices.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, devices, structures, computer-implemented methods, apparatuses, and/or computer program products that facilitate three-dimensional monolithic vertical field effect transistor logic gates are provided.

According to an embodiment, a logic device can comprise a first vertical transport field effect transistor formed over and adjacent a substrate and a first bonding film deposited over the first vertical transport field effect transistor. The logic device can also comprise a second vertical transport field effect transistor comprising a second bonding film and stacked on the first vertical transport field effect transistor. In an example, the second bonding film can affix the second vertical transport field effect transistor to the first vertical transport field effect transistor. In addition, the logic device can comprise one or more monolithic inter-layer vias that extend from first respective portions of the second vertical transport field effect transistor to second respective portions of the first vertical transport field effect transistor and through the first bonding film and the second bonding film.

Another embodiment relates to a method that can comprise forming a first vertical transport field effect transistor over and adjacent a substrate and depositing a first bonding film on the first vertical transport field effect transistor. The method can also comprise forming a second vertical transport field effect transistor over and adjacent the first vertical transport field effect transistor. The second vertical transport field effect transistor can comprise a second bonding film. Further, the method can comprise using the second bonding film to adhere the second vertical transport field effect transistor to the first vertical transport field effect transistor. The second vertical transport field effect transistor can be stacked on the first vertical transport field effect transistor. In addition, the method can comprise defining and etching one or more monolithic inter-layer vias from first respective portions of the second vertical transport field effect transistor and to second respective portions of the first vertical transport field effect transistor. The etching can comprise etching the one or more monolithic inter-layer vias through the first bonding film and the second bonding film.

A further embodiment relates to a semiconductor chip that can comprise a first vertical transport field effect transistor formed over and adjacent a substrate and a first bonding film deposited on the first vertical transport field effect transistor. The semiconductor chip can also comprise a second vertical transport field effect transistor stacked on the first vertical transport field effect transistor. The second vertical transport field effect transistor can comprise a second bonding film. The second bonding film can affix the second vertical transport field effect transistor to the first vertical transport field effect transistor. Further, the semiconductor chip can comprise one or more monolithic inter-layer vias that can extend from first respective portions of the second vertical transport field effect transistor to second respective portions of the first vertical transport field effect transistor and through the first bonding film and the second bonding film.

These and other features will become apparent from the following detailed description of illustrative embodiments thereof, which is to be read in connection with the accompanying drawings.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

The various embodiments described here relate to stacked vertical transport field effect transistors (VTFETs) logic cells that can be utilized for three-dimensional (3D) monolithic integration. For example, the various aspects can be utilized for heterogeneous integration where an n-channel field effect transistor (NFET) and a p-channel field effect transistor (PFET) temperature cycles can be different. Further, the various aspects can be utilized to reduce the areal dimensions of a given circuit, resulting in tighter packing of circuits in order for reduction of back-end of line (BEOL) wire length and the associated power and performance benefits. In addition, the various aspects can be utilized to provide a higher drive strength in a given areal footprint. Further, various logic functions can be accomplished with a single unit (NAND or NOR,) for improvement of uniformity of processing. In addition, the various aspects can relate to vertically stacking and bonding together a first vertical FET and a second vertical FET. The vertical stacking and bonding can provide a semiconductor chip that can have a reduced size or smaller footprint, which can reduce an overall size of the semiconductor chip and/or can facilitate space for other devices to be included on the semiconductor chip.

Figure 1:
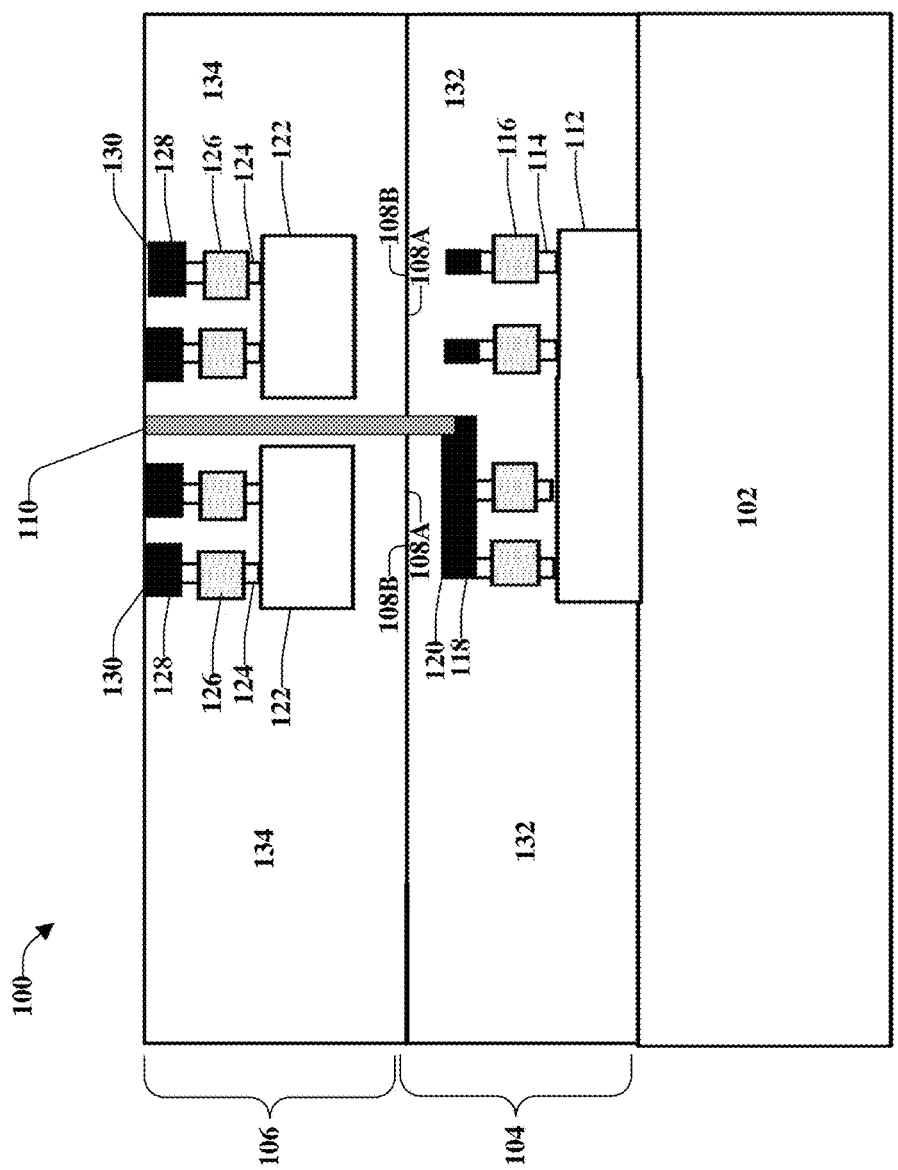
FIG. 1 illustrates a cross-sectional view of an example, non-limiting vertical transport field effect transistor structure for three-dimensional monolithic vertical field effect transistor logic gates in accordance with one or more embodiments described herein.

FIG. 1 illustrates a cross-sectional view of an example, non-limiting vertical transport field effect transistor structure 100 for three-dimensional monolithic vertical field effect transistor logic gates in accordance with one or more embodiments described herein.

The vertical transport field effect transistor structure 100 can comprise a layered stack structure formed on a substrate 102. Material used for the substrate 102 can vary. In an aspect, the substrate 102 can comprise a silicon wafer. According to another aspect, the substrate 102 can comprise silicon dioxide on top of a silicon wafer. In another aspect, the substrate can comprise a compound semiconductor such as Indium gallium arsenide (InGaAs) or indium phosphide (InP).

The layered stack structure can comprise a first vertical transport field effect transistor 104, a second vertical transport field effect transistor 106, a first bonding layer 108a, and a second bonding layer 108b deposited between the first vertical transport field effect transistor 104 and the second vertical transport field effect transistor 106. The second vertical transport field effect transistor 106 can be stacked on the first vertical transport field effect transistor 104. Thus, the second vertical transport field effect transistor 106 can be referred to as a top-tier device (e.g., an upper-tier formation) and the first vertical transport field effect transistor 104 can be referred to as a bottom-tier device (e.g., a lower-tier formation).

The first bonding layer 108a and the second bonding layer 108b can be an interface (e.g., an interfacial region) between the first vertical transport field effect transistor 104 and the second vertical transport field effect transistor 106. For example, the first bonding layer 108a and the second bonding layer 108b can represent an interfacial region between the lower-tier formation and the upper-tier formation. The first bonding layer 108a can comprise a first bonding film and the second bonding layer 108b can comprise a second bonding film. For example, the first bonding film and the second bonding film can comprise an oxide-to-oxide bond. For example, a thin film of oxide (e.g., the first bonding layer 108a) can be placed on top of the first vertical transport field effect transistor 104 and a second thin film of oxide (e.g., the second bonding layer 108b) can be placed on a bottom of the second vertical transport field effect transistor 106, which can facilitate bonding between the vertical transport field effect transistors.

According to an implementation, the first bonding film (e.g., the first bonding layer 108a) can be deposited on the first vertical transport field effect transistor 104 prior to formation of the second vertical transport field effect transistor 106. A substrate comprising the second bonding layer 108b and a third doped layer 122 of the second vertical transport field effect transistor 106 can be placed, as a unit on or over the first bonding layer 108a. Further to this implementation, the second bonding layer 108b can be configured to affix the second vertical transport field effect transistor 106 to the first vertical transport field effect transistor 104 via the first bonding layer 108a.

Further, the vertical transport field effect transistor structure 100 can comprise one or more monolithic inter-layer vias. FIG. 1 illustrates a single monolithic inter-layer via 110 for purposes of simplicity. The one or more monolithic inter-layer vias (e.g., the monolithic inter-layer via 110) can extend from respective portions of the second vertical transport field effect transistor 106 to respective portions of the first vertical transport field effect transistor 104. For example, at least one monolithic inter-layer via can extend from a first metallurgy on the first vertical transport field effect transistor 104 to a second metallurgy on the second vertical transport field effect transistor 106. In another example, at least one monolithic inter-layer via can penetrate and contact respective gate layers of the first vertical transport field effect transistor 104 and the second vertical transport field effect transistor 106

The one or more monolithic inter-layer vias (e.g., the monolithic inter-layer via 110) can also be formed through the first bonding layer 108a and the second bonding layer 108b. Thus, portions of the first bonding layer 108a and the second bonding layer 108b are not removed during formation and/or stacking of the second vertical transport field effect transistor 106 on the first vertical transport field effect transistor 104 and/or during formation of the one or more monolithic inter-layer vias.

According to an implementation, the first vertical transport field effect transistor 104 can comprise a first doped layer 112 formed on the substrate 102. The first doped layer 112 can be, for example, a drain of the first vertical transport field effect transistor 104 (e.g., a bottom drain). A first semiconducting layer 114 can be formed on the first doped layer 112. In an example, the first semiconducting layer 114 can be a FET body. In another example, the first semiconducting layer 114 can be one or more fins formed on the first doped layer 112. For example, as illustrated, four fins can be formed on the first doped layer 112. However, a different number of fins can be formed on the first doped layer 112 in accordance with various implementations.

Further, a first gate layer 116 can be formed around respective first elements of the first semiconducting layer 114. For example, gates can be formed around the fins of the first semiconducting layer 114. Thus, a first gate can be formed around (e.g., wrapped around) a first fin, a second gate can be formed around a second fin, and so on. As illustrated the first semiconducting layer 114 can extend through the first gate layer 116 and, therefore, portions of the first semiconducting layer 114 can extend below and above the first gate layer 116.

A second doped layer 118 can be formed over the first semiconducting layer 114. According to an implementation, the second doped layer 118 can be, for example, a top junction. In an example, the second doped layer 118 can be a source region of the first vertical transport field effect transistor 104 (e.g., a top source). Further, a first contact layer 120 can be formed on the second doped layer 118. Thus, electrical current can flow vertically from the bottom (e.g., the first doped layer 112) to the top (e.g., the second doped layer 118) of the vertical transport field effect transistor structure 100. According to an implementation, the first bonding layer 108a can be formed over the second doped layer 118. Further details related to the layers of the first vertical transport field effect transistor 104 will be discussed below with respect to FIG. 2.

Further to the implementation of FIG. 1, the second vertical transport field effect transistor 106 can comprise the second bonding layer 108b and the third doped layer 122 placed over the first contact layer 120 (e.g., on the first bonding layer 108a). According to an implementation, the second bonding film (e.g., the second bonding layer 108b) and the third doped layer 122 can form a substrate that can be formed separately and then placed on the first vertical transport field effect transistor 104. The oxide films (e.g., the first bonding layer 108a and the second bonding layer 108b) can adhere to one another. Thereafter, the second tier can be fabricated staring with the third doped layer 122, which can comprise monocrystalline silicon.

The third doped layer 122 can be, for example, a drain region of the second vertical transport field effect transistor 106 (e.g., a bottom drain). A second semiconducting layer 124 can be formed on the third doped layer 122. The second semiconducting layer 124 can be a FET body and/or can comprise one or more fins formed on the third doped layer 122. Further, a second gate layer 126 can be formed around respective second elements of the second semiconducting layer 124. For example, a first gate (of the second gate layer 126) can be formed, or wrapped, around a first fin (of the second semiconducting layer 124). A fourth doped layer 128 can be formed over the second semiconducting layer 124. According to an implementation, the fourth doped layer 128 can be a source region of the second vertical transport field effect transistor 106 (e.g., a top source). A second contact layer 130 can be formed on the fourth doped layer 128. Further details related to the layers of the second vertical transport field effect transistor 106 will be discussed below with respect to FIGS. 3-10.

As illustrated the first vertical transport field effect transistor 104 can be surrounded by a first dielectric layer 132. Further, the second vertical transport field effect transistor 106 can be surrounded by a second dielectric layer 134. The first dielectric layer 132 and the second dielectric layer 134 can be formed from an electrically insulating material, a dielectric material, or a combination thereof. In addition, the first dielectric layer 132 and the second dielectric layer 134 can be formed using, but not limited to, a physical vapor deposition process, a chemical vapor deposition process, a spin-on deposition process, or combinations thereof.

Figure 2:
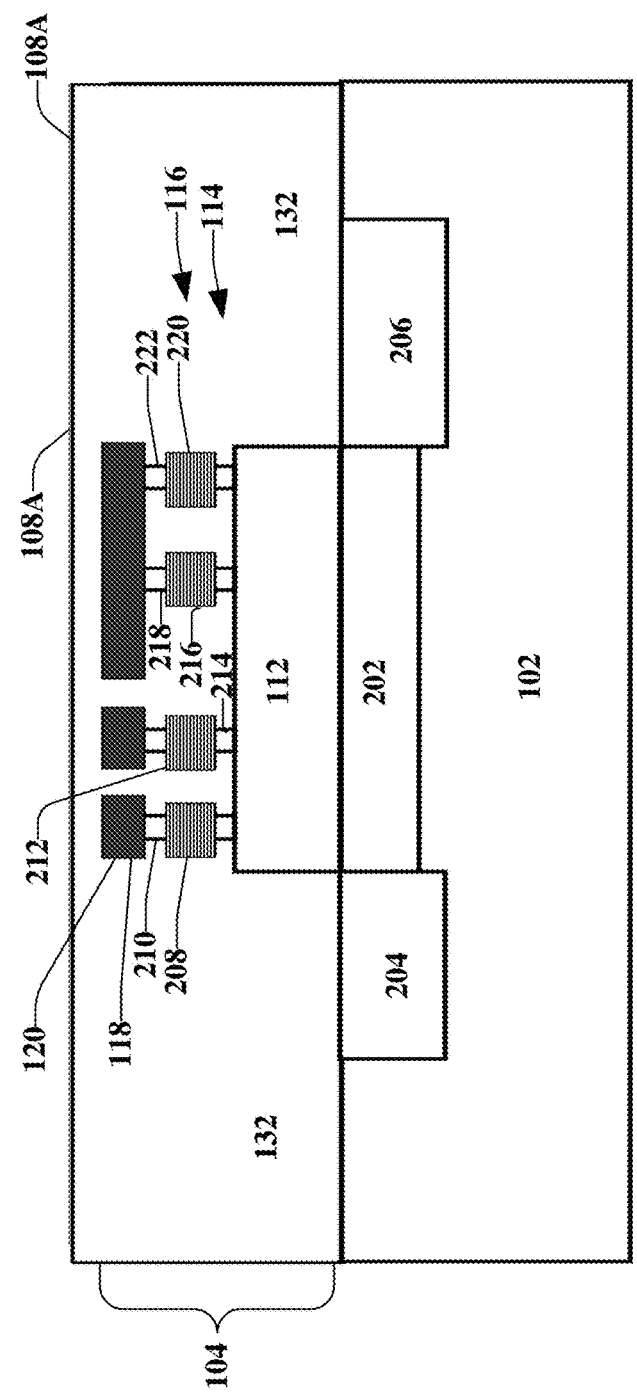
FIG. 2 illustrates a cross-sectional view of formation of a first vertical transport field effect transistor in accordance with one or more embodiments described herein.

FIG. 2 illustrates a cross-sectional view of formation of a first vertical transport field effect transistor in accordance with one or more embodiments described herein. Repetitive description of like elements employed in other embodiments described herein is omitted for sake of brevity.

A base layer can comprise the substrate 102 and a well region 202 formed in the substrate 102. According to an implementation, the substrate 102 can be a lightly doped p-type substrate and the well region 202 can be an n-well. The n-type well can be created for p-channel devices and n-channel devices on the p-type substrate. The n-type well can be formed in the substrate between or below a first dielectric isolation region 204 and a second dielectric isolation region 206.

Further, although discussed with respect to an n-type well, according to some implementations, the substrate can be an n-type substrate and the well region can be a p-well. Fabrication of the p-well can be similar to fabrication of an n-well, however, a p-well can be implanted to form n-transistors.

The first doped layer 112 can be deposited and etched over the substrate 102 and well region 202. For example, the first doped layer 112 can be deposited and patterned on the substrate 102. According to an implementation, the substrate 102 can be a p-substrate, the well region 202 can be an n-well, and the first doped layer can be a P+ doped layer.

The first doped layer 112 (e.g., a bottom drain) can be formed by epitaxy with in-situ doping). In example embodiments, the first doped layer 112 can be formed sequentially on the substrate via epitaxial growth (e.g., formed by epitaxy). The first doped layer 112 can be doped in situ. In example embodiments, epitaxial growth of the first doped layer can be performed in a single integrated epitaxy process. Alternatively, any suitable doping technique (e.g., ion implantation, plasma doping, etc.) can be used to form the first doped layer 112.

According to an implementation, the first doped layer 112 can comprise a conducting material (e.g., the first doped layer can be a conductor). For example, the first doped layer 112 can be a heavily doped semiconductor. Further, in some implementations, the first doped layer 112 can be a bottom drain and can be a highly conductive region.

The first semiconducting layer 114 can be deposited and etched on the first doped layer 112. For example, the first semiconducting layer 114 can be etched to form one or more fins that extend vertically upward from the first doped layer 112. By way of example and not limitation, the one or more fins can extend vertically about 40 nanometers to 50 nanometers above the first doped layer 112. However, the disclosed aspects are not limited to this measurement.

As illustrated, the first semiconducting layer 114 can comprise four fins, however, another number of fins can be utilized with the disclosed aspects. Wrapped around the fins can be respective gates that form the first gate layer 116. As illustrated, the fins can extend above and below the gates. For example, a first gate 208 can be wrapped around a first fin 210 (e.g., in a circumference), a second gate 212 can be wrapped around a second fin 214, a third gate 216 can be wrapped around a third fin 218, and a fourth gate 220 can be wrapped around a fourth fin 222. Accordingly, the structure illustrated in FIG. 2 can be gated from four sides when viewed from the top down.

According to some implementations, the fins of the first semiconducting layer 114 can have respective oxide layers, such as respective gate oxide layers around the fins. An additional dielectric layer, for example, a high-k dielectric (e.g., a dielectric material having a high dielectric constant k) can cover the gate oxide layer of the fins.

The second doped layer 118 can be formed on the first semiconducting layer 114. For example, the second doped layer 118 can be a top junction or a top source. The second doped layer 118 can be formed by epitaxy with in-situ doping. In an implementation, the second doped layer 118 can be formed sequentially on the substrate via epitaxial growth (e.g., formed by epitaxy). The second doped layer 118 can be doped in situ. In example embodiments, epitaxial growth of the second doped layer 118 can be performed in a single integrated epitaxy process. Alternatively, any suitable doping technique (e.g., ion implantation, plasma doping, etc.) can be used to form the second doped layer 118. According to an implementation, the second doped layer 118 can be highly doped to make a solid contact with the first contact layer 120.

The first contact layer 120 can be deposited and formed on the second doped layer 118. The first contact layer 120 can be a top source. According to some implementations, the first contact layer 120 can be an epitaxy film or epitaxy layer. Further, the material of the first contact layer 120 can be formed of a metallic material or a non-metallic material. If the material is metallic, the material can be refractory since additional high temperature processing can be performed later in the process. The first bonding film (e.g., the first bonding layer 108a) can be applied over the first contact layer 120 as discussed herein.

In operation, electrical current can be pulled out of the top of the device. For example, the electrical current can flow vertically from the bottom to the top. Thus, the current can flow in a direction from the first doped layer 112 to the second doped layer 118.

It is noted that although the various aspects are illustrated and described with respect to one or more PFETs on a bottom-tier, and one or more NFETs located on a top-tier of a structure, the disclosed aspects are not limited to this implementation. Instead, the NFETs can be located on the bottom-tier and the PFETs can be located on the top-tier of the structure. In addition, although the various aspects illustrate an NAND device, the disclosed aspects are not limited to this implementation and instead the various aspects can be utilized for a NOR device, an inverter device, or other logic devices.

Figure 3:
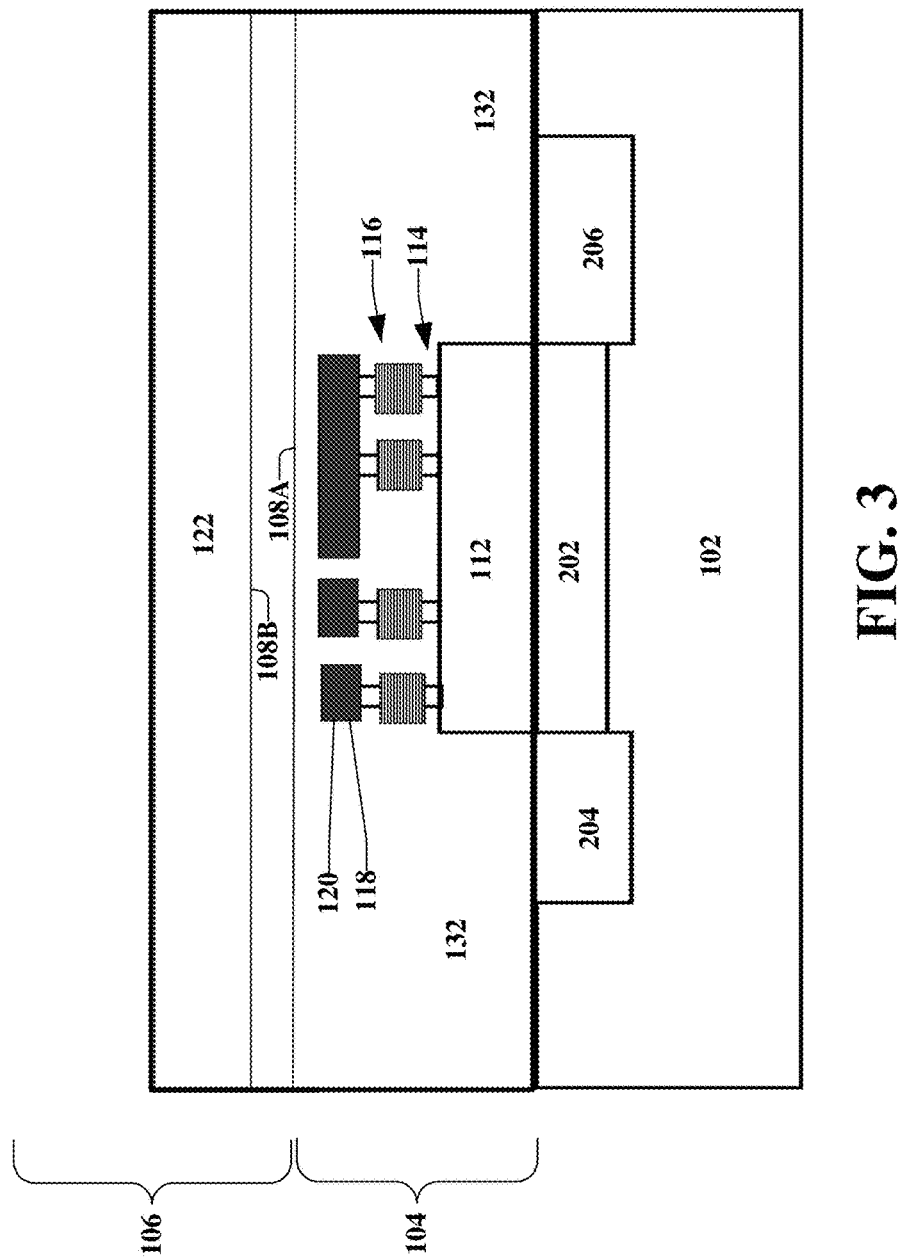
FIG. 3 illustrates a cross-sectional view of a first stage of formation of a second vertical transport field effect transistor in accordance with one or more embodiments described herein.

FIG. 3 illustrates a cross-sectional view of a first stage of formation of a second vertical transport field effect transistor in accordance with one or more embodiments described herein. Repetitive description of like elements employed in other embodiments described herein is omitted for sake of brevity.

Although not explicitly illustrated, the first bonding layer 108a can be applied over the first vertical transport field effect transistor 104. According to some implementations the first bonding layer 108a can comprise an oxide-to-oxide film. The first bonding layer 108a can be a bonding dielectric, which can be planarized.

The third doped layer 122 and a second bonding layer 108b can be deposited and bonded to the first contact layer 120. The third doped layer 122 can be etched over the second doped layer 118 or over the first contact layer 120. The third doped layer 122 can be, for example, a drain of the second vertical transport field effect transistor 106 (e.g., a bottom drain). For example, the third doped layer 122 can be deposited and patterned. The third doped layer 122 can comprise a conducting material. According to some implementations, the third doped layer 122 can be formed of a material comprising monocrystalline and silicon. According to some implementations, the first bonding layer 108a can be approximately a 30 nm thick silicon on oxide bonded to the top of the wafer.

According to an implementation, the third doped layer 122 can be N+ doped. For example, according to some implementations, the first doped layer 112 of the first vertical transport field effect transistor 104 can be P+ doped and the third doped layer 122 of the second vertical transport field effect transistor 106 can be N+ doped. However, the disclosed aspects are not limited to this implementation and the first doped layer 112 can be N+ doped and the third doped layer 122 can be P+ doped. The determination of the doping (e.g., N-doped, P-doped) of the layers can be dependent on the logic device being formed (e.g., NOR device, NAND device, inverter device, and so on).

Figure 4:
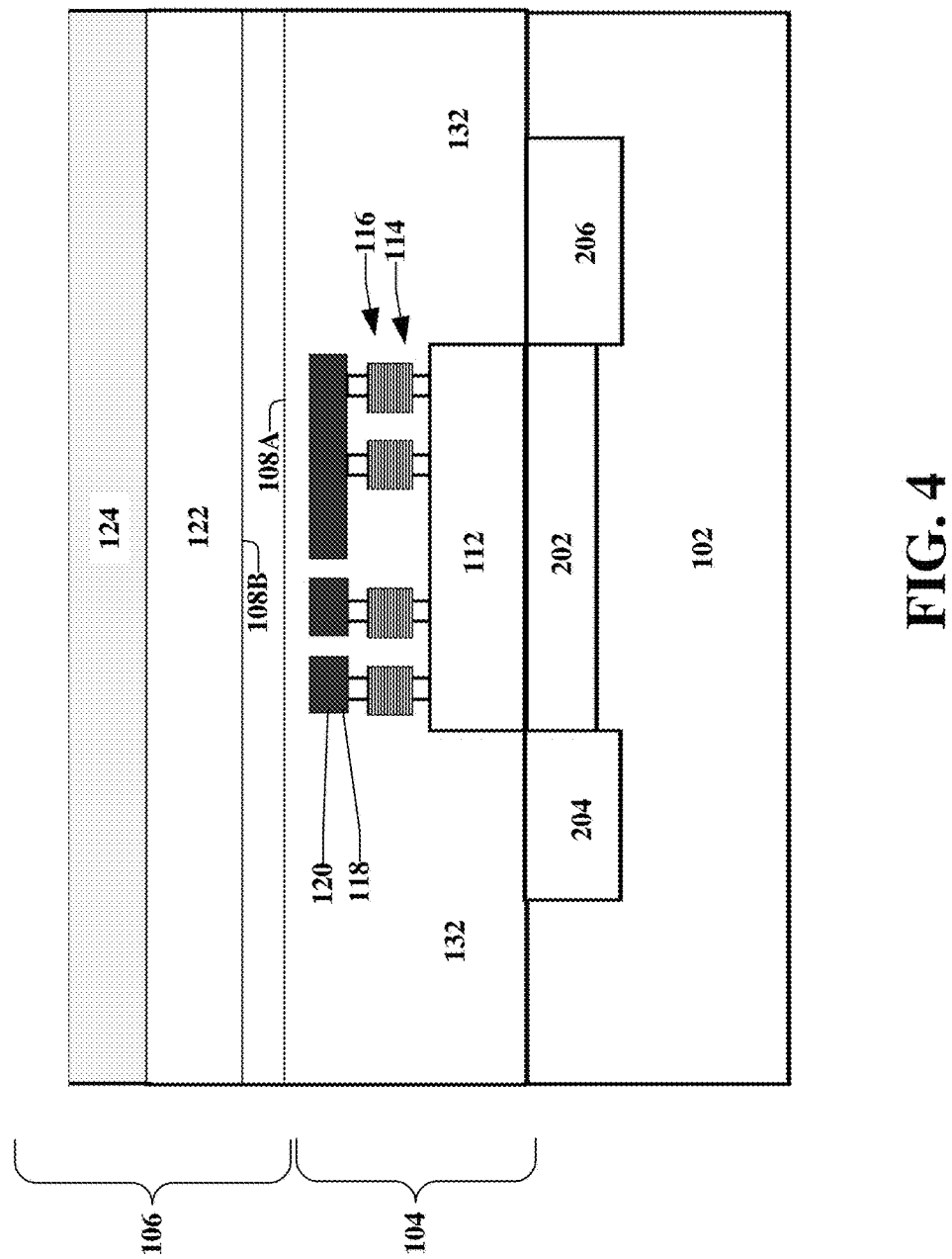
FIG. 4 illustrates a cross-sectional view of formation of a semiconducting layer of the second vertical transport field effect transistor in accordance with one or more embodiments described herein.

FIG. 4 illustrates a cross-sectional view of formation of a semiconducting layer of the second vertical transport field effect transistor in accordance with one or more embodiments described herein. Repetitive description of like elements employed in other embodiments described herein is omitted for sake of brevity.

The second semiconducting layer 124 can be deposited on the third doped layer 122. According to some implementations, an updoped epitaxial (EPI) can be grown for the active body (e.g., the second semiconducting layer 124). For example, a wafer of semiconducting material can be fabricated by epitaxial growth (epitaxy). During this portion of the fabrication process (as well as during other portions), the temperature can be controlled in order to not affect the first vertical transport field effect transistor 104.

Figure 5:
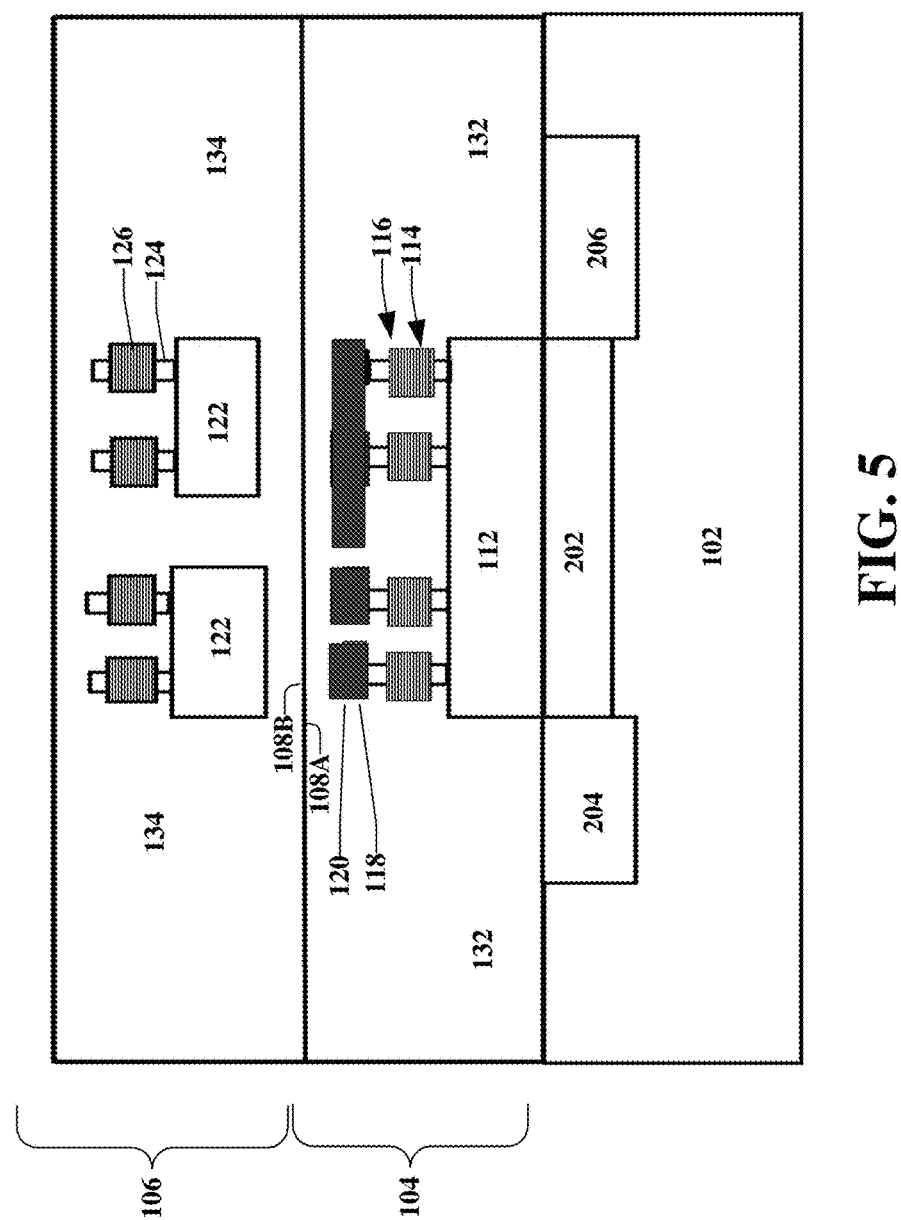
FIG. 5 illustrates a cross-sectional view of formation of a gate layer of the second vertical transport field effect transistor in accordance with one or more embodiments described herein.

After formation of the second semiconducting layer 124 on the third doped layer 122, both layers can be masked and etched, as depicted in FIG. 5, which illustrates a cross-sectional view of formation of a gate layer of the second vertical transport field effect transistor 106 in accordance with one or more embodiments described herein. Repetitive description of like elements employed in other embodiments described herein is omitted for sake of brevity.

According to some implementations, the second semiconducting layer 124 can be etched to form one or more fins that can extend vertically upward from the third doped layer 122. By way of example and not limitation, the one or more fins can extend vertically about 40 nanometers to 50 nanometers above the third doped layer 122. However, in other implementations, the fins can extend less than 40 nanometers or more than 50 nanometers above the third doped layer 122. In some implementations, the second semiconducting layer 124 can be etched into four fins, however, the disclosed aspects are not limited to this specific implementation.

A second gate layer 126 can be formed around respective second elements of the second semiconducting layer 124. For example, the respective second elements can be fins. The fins can extend above and below the gates (e.g., the second gate layer 126 contacts a portion of the second semiconducting layer 124.

According to some implementations, the fins of the second semiconducting layer 124 can have respective oxide layers around the fins. For example, the second semiconducting layer 124 can have respective thick gate oxide layers around the fins. An additional dielectric layer, for example, a high-k dielectric (e.g., a dielectric material having a high dielectric constant k) can cover the thick gate oxide layer of the fins.

During formation of the second vertical transport field effect transistor 106, thermal cycles can be limited per various monolithic parameters. For example, the thermal cycles can be limited up to, but not including the metallic contact (e.g., a contact area).

Figure 6:
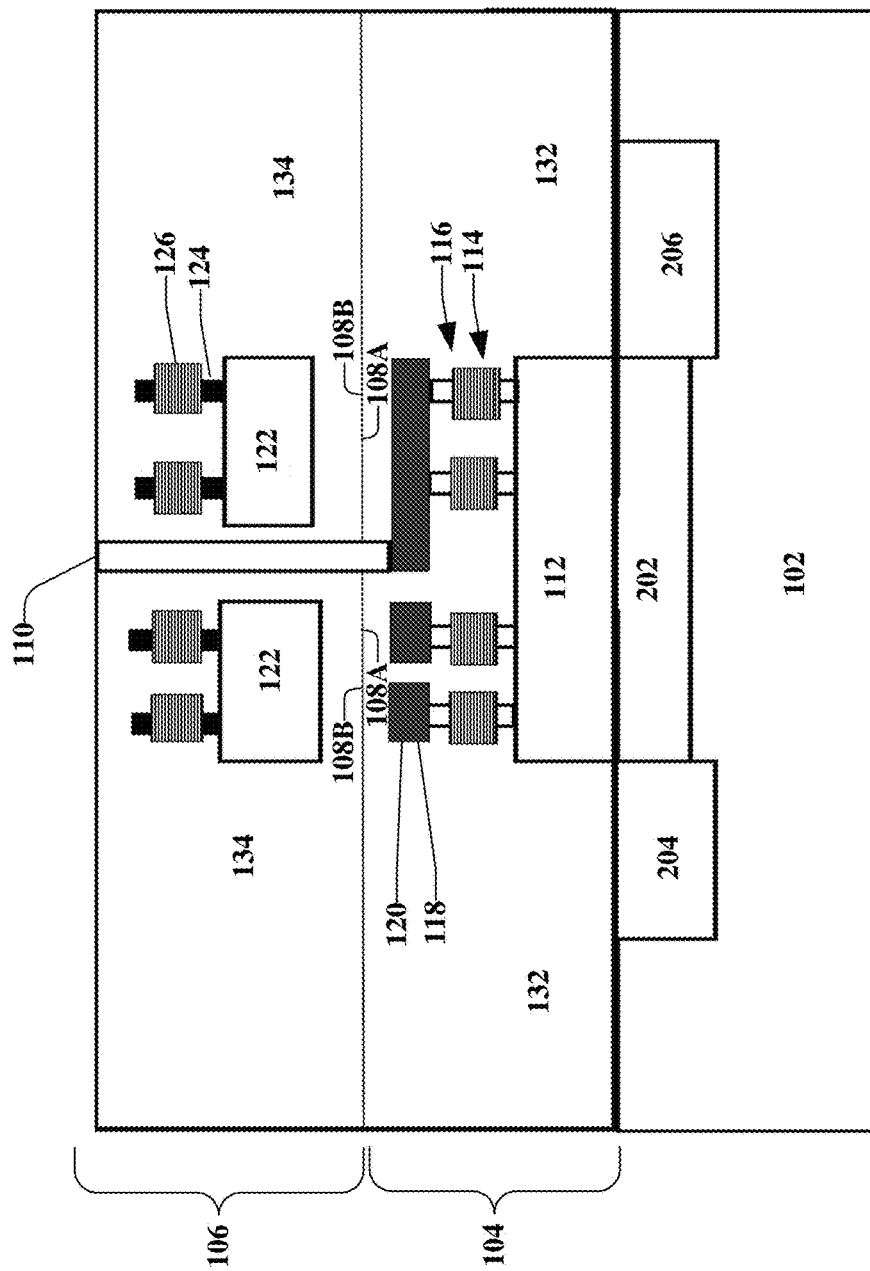
FIG. 6 illustrates a cross-sectional view of formation of a monolithic inter-layer via in a vertical transport field effect transistor structure in accordance with one or more embodiments described herein.
Figure 7:
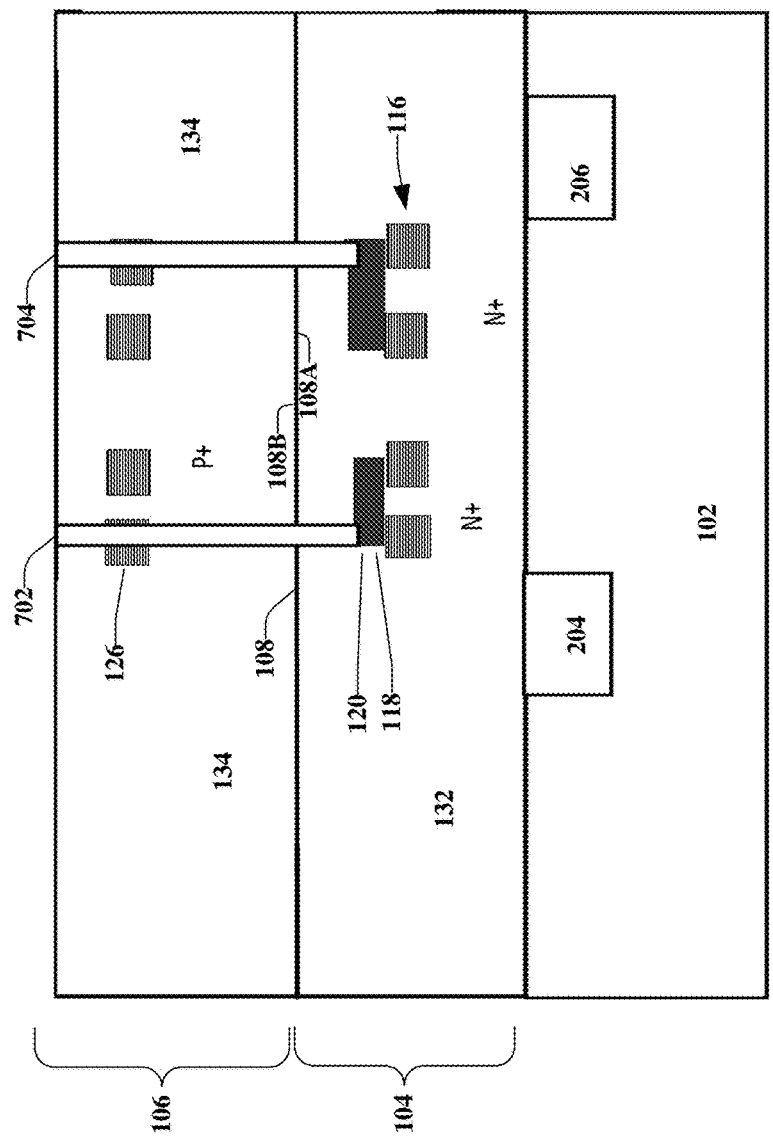
FIG. 7 illustrates an alternative cross-sectional view of formation of one or more monolithic inter-layer vias in a vertical transport field effect transistor structure in accordance with one or more embodiments described herein.

FIG. 6 illustrates a cross-sectional view of formation of a monolithic inter-layer via in a vertical transport field effect transistors structure in accordance with one or more embodiments described herein. FIG. 7 illustrates an alternative cross-sectional view of formation of one or more monolithic inter-layer vias in a vertical transport field effect transistors structure in accordance with one or more embodiments described herein. Repetitive description of like elements employed in other embodiments described herein is omitted for sake of brevity.

As illustrated, one or more monolithic inter-layer vias can be defined and etched. FIG. 6 illustrates one monolithic inter-layer via 110. It is noted that although only a single monolithic inter-layer via 110 is illustrated, according to some implementations more than one monolithic inter-layer via can be included on a device. For example, FIG. 7 illustrates a first monolithic inter-layer via 702 and a second monolithic-interlayer via 704 formed in different areas of the vertical transport field effect transistor structure and can extend from first portions of the first vertical transport field effect transistor 104 to second portions of the second vertical transport field effect transistor 106.

The one or more monolithic inter-layer vias 110, 702, 704 can be drilled through the first bonding layer 108a and the second bonding layer 108b. Thus, portions of the first bonding layer 108a and the second bonding layer 108b are not removed prior to the formation of the one or more monolithic-inter-layer vias. A location and/or number of monolithic inter-layer vias can be chosen based on the type of device being fabricated (e.g., a NOR device, a NAND device, an inverter, or another logic device).

In some implementations, the one or more monolithic inter-layer vias can be defined and etched. The etching can penetrate the gate contact (PB) region (e.g., the second gate layer 126). Thus, the gate contact can be penetrated (not the active part of the electrical circuit). According to some implementations, etching the one or more monolithic inter-layer vias 110, 702, and 704 can be performed at about a same time or at different times. The timing of the etching can be a function of etch rates and etch stops, for example.

Figure 8:
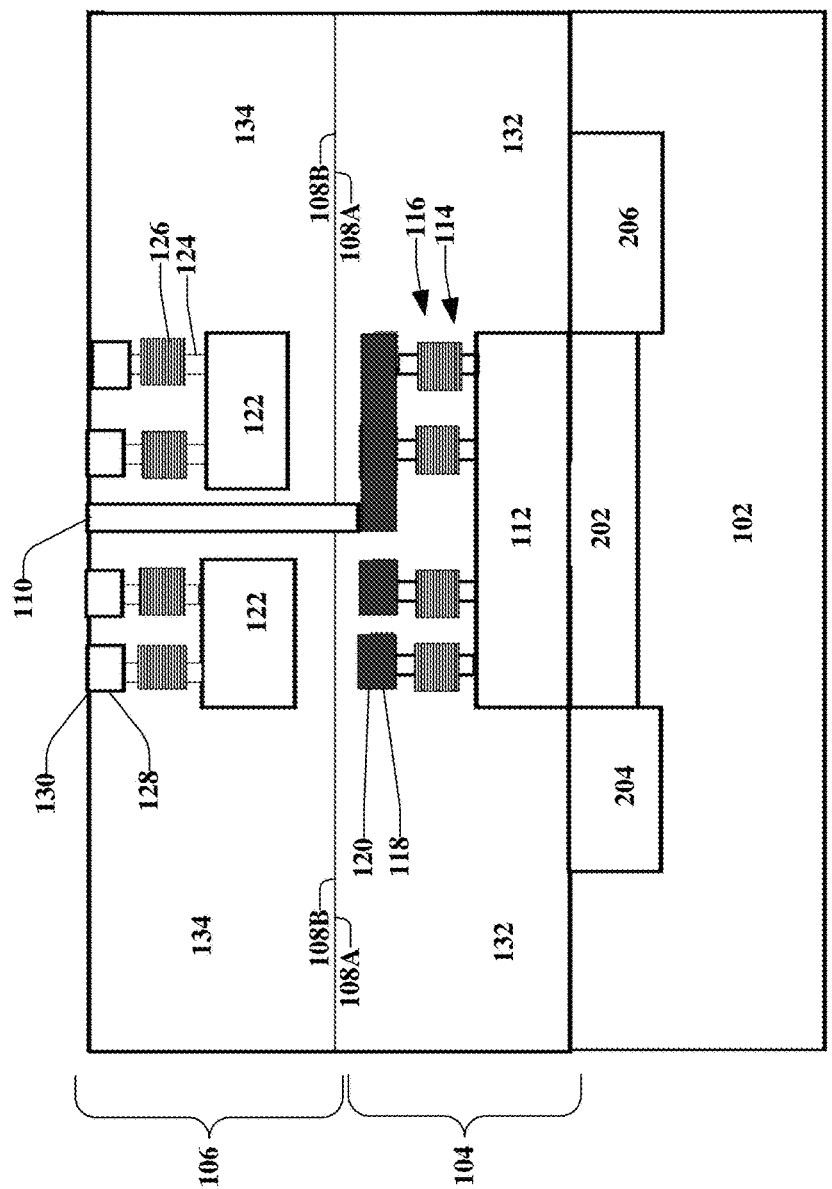
FIG. 8 illustrates a cross-sectional view of formation of a contact area layer in accordance with one or more embodiments described herein.

FIG. 8 illustrates a cross-sectional view of formation of a contact area layer in accordance with one or more embodiments described herein. Repetitive description of like elements employed in other embodiments described herein is omitted for sake of brevity.

As illustrated, the fourth doped layer 128 can be formed over the second semiconducting layer 124. The fourth doped layer 128 can be a top source (e.g., a source region) of the second vertical transport field effect transistor 106. A second contact layer 130 (e.g., a top contact layer) can be defined and etched over the fourth doped layer 128. According to an implementation, forming the fourth doped layer 128 and defining and etching the second contact layer 130 can be performed after defining and etching the one or more monolithic inter-layer vias as illustrated. However, according to other implementations, forming the fourth doped layer 128 and defining and etching the second contact layer 130 can be performed before defining and etching the one or more monolithic inter-layer vias.

Figure 9:
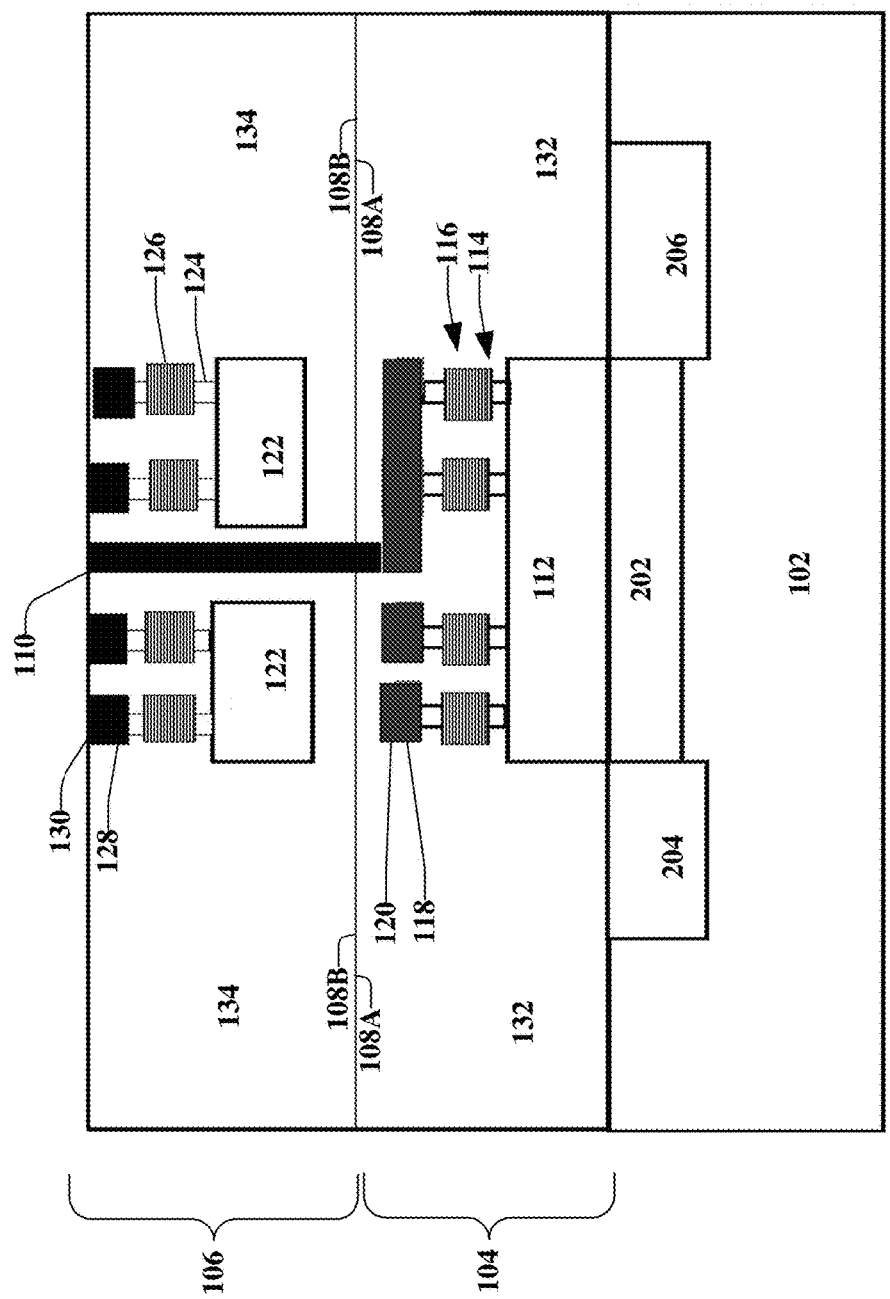
FIG. 9 illustrates a cross-sectional view of filling the top contact area and the monolithic inter-layer via in accordance with one or more embodiments described herein.
Figure 10:
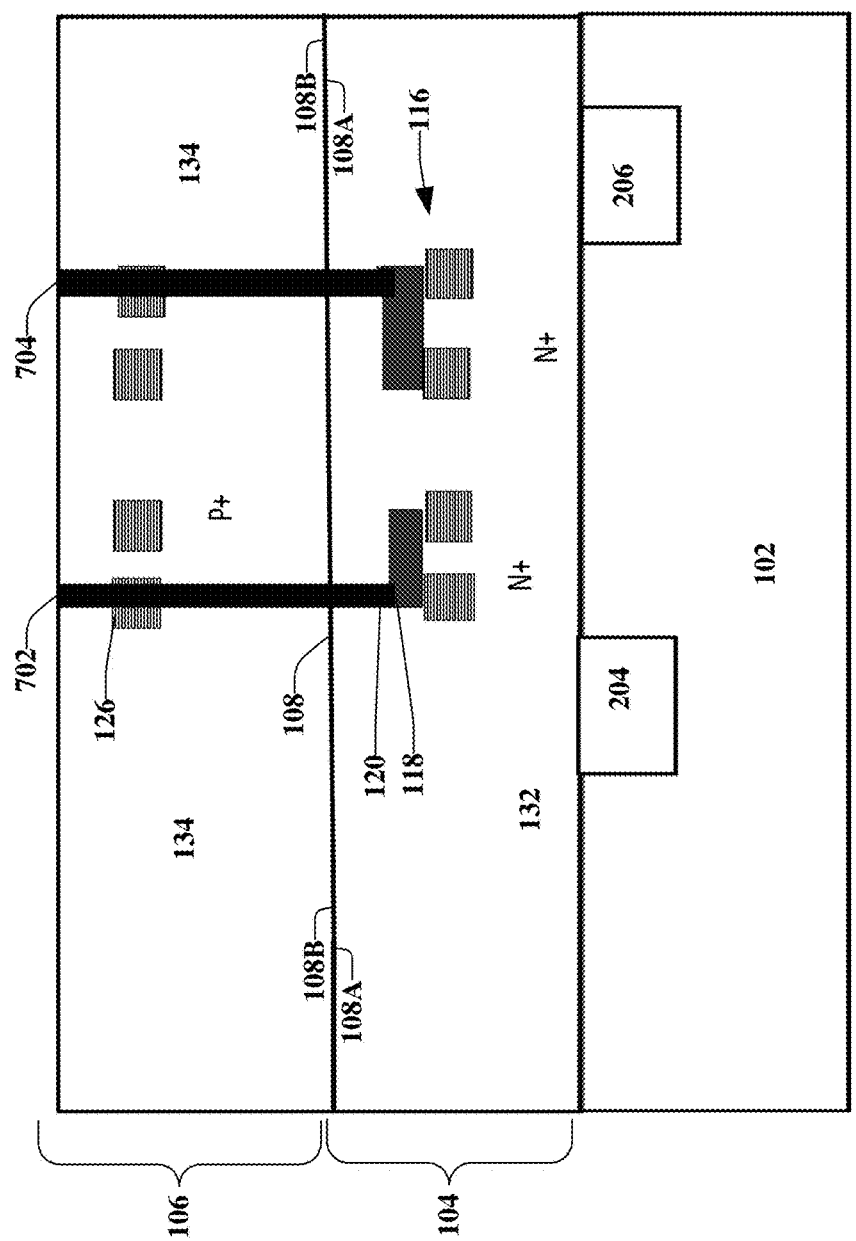
FIG. 10 illustrates a cross-sectional view of an alternative embodiment of filling the top contact area and one or more monolithic inter-layer vias in accordance with one or more embodiments described herein.

FIG. 9 illustrates a cross-sectional view of filling the second contact layer 130 and the monolithic inter-layer via in accordance with one or more embodiments described herein. FIG. 10 illustrates a cross-sectional view of an alternative embodiment of filling the second contact layer 130 and the one monolithic inter-layer via in accordance with one or more embodiments described herein. Repetitive description of like elements employed in other embodiments described herein is omitted for sake of brevity.

As illustrated, the second contact layer 130 and the one or more monolithic inter-layer vias 110, 702, 704 can be filled. The vias can be filled with a conductive material (e.g., a metal) including, but not limited to, indium-tin oxide, indium-zinc oxide, aluminum-zinc oxide, titanium, aluminum molybdenum, copper, cobalt, silver, gold, nickel, tungsten, chromium, hafnium, platinum, iron and their alloys.

According to some implementations, the second contact layer 130 and the one or more monolithic inter-layer vias 110, 702, 704 can be filled at about the same time (e.g., concurrently). However, according to other implementations, the second contact layer 130 and the one or more monolithic inter-layer vias 110, 702, 704 can be filled at different times.

Although not illustrated, various metallurgy can be formed over the second contact layer 130. For example, various layers, such as an M1, M2, M3, and so on, can be formed above the second contact layer 130.

Figure 12:
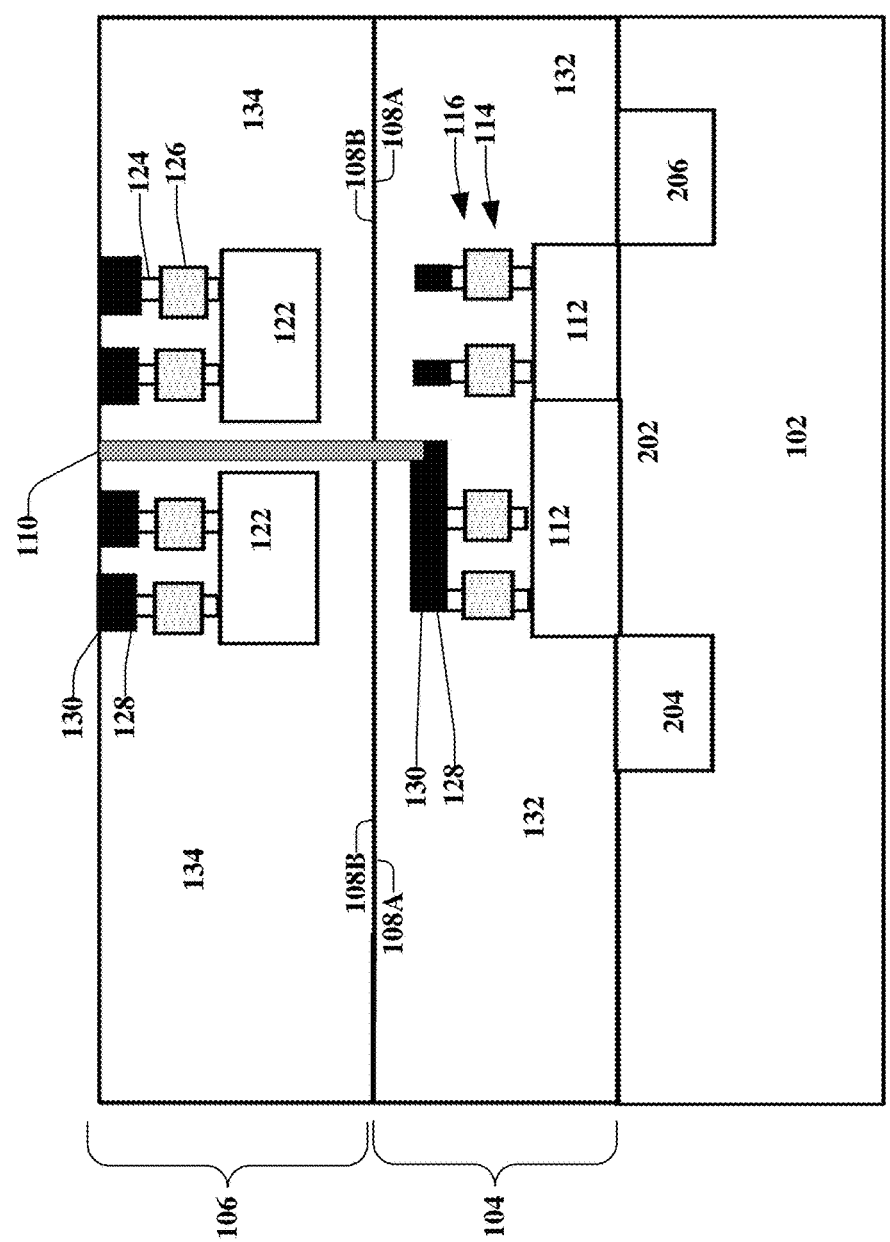
FIG. 12 illustrates an example, non-limiting cross-sectional view of a first layout of the structure of FIGS. 11A and 11B in accordance with one or more embodiments described herein.
Figure 13:
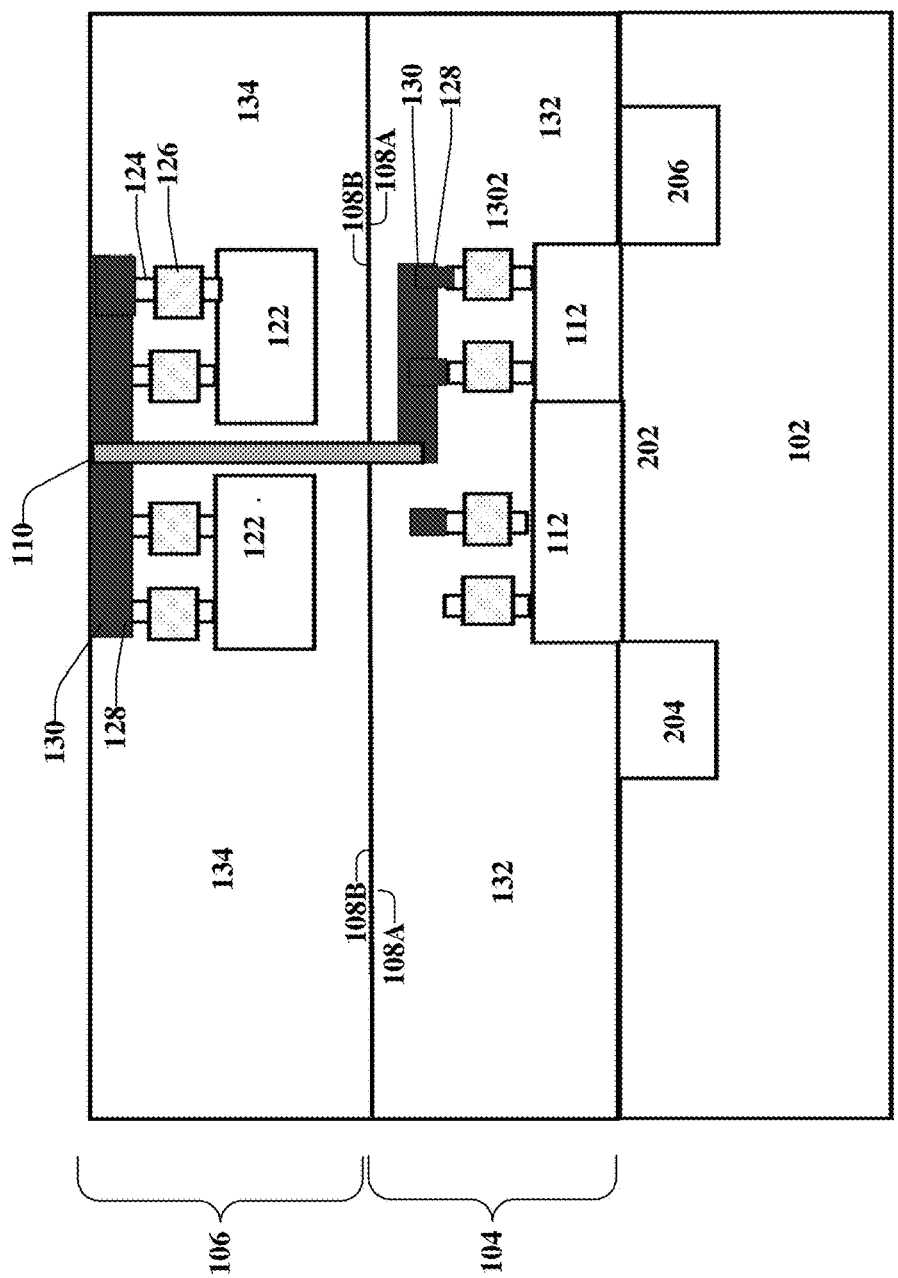
FIG. 13 illustrates an example, non-limiting cross-sectional view of a second layout of the structure of FIGS. 11A and 11B in accordance with one or more embodiments described herein.
Figure 14:
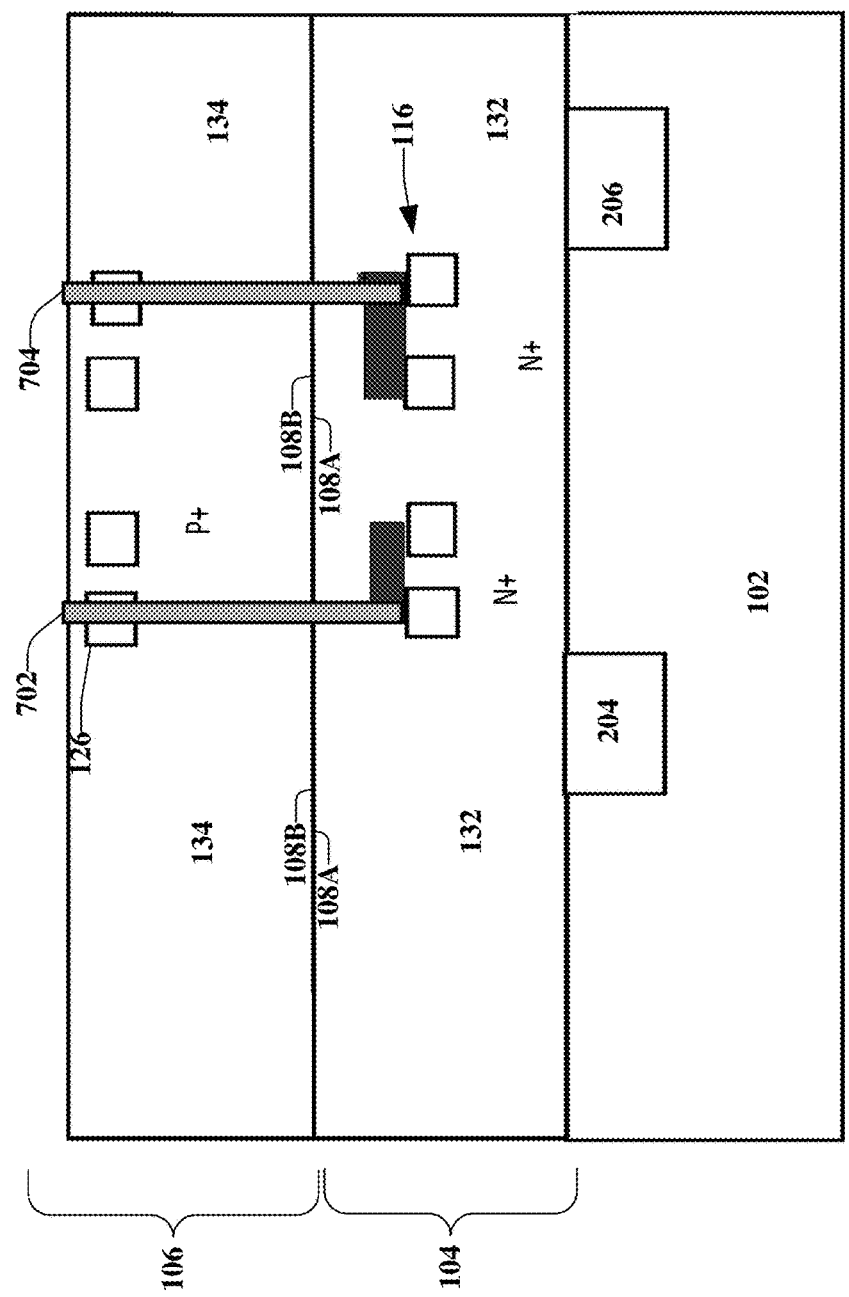
FIG. 14 illustrates an example, non-limiting cross-sectional view of a third layout of the structure of FIGS. 11A and 11B in accordance with one or more embodiments described herein.

To further illustrate the various aspects discussed herein, FIG. 11A illustrates a top down view of the second vertical transport field effect transistor 106 and FIG. 11B illustrates a top down view of the first vertical transport field effect transistor 104 in accordance with one or more embodiments described herein. Cross-sectional views of FIGS. 11A and 11B are illustrated in FIGS. 12-14 in accordance with one or more embodiments described herein. Repetitive description of like elements employed in other embodiments described herein is omitted for sake of brevity.

Figure 11:
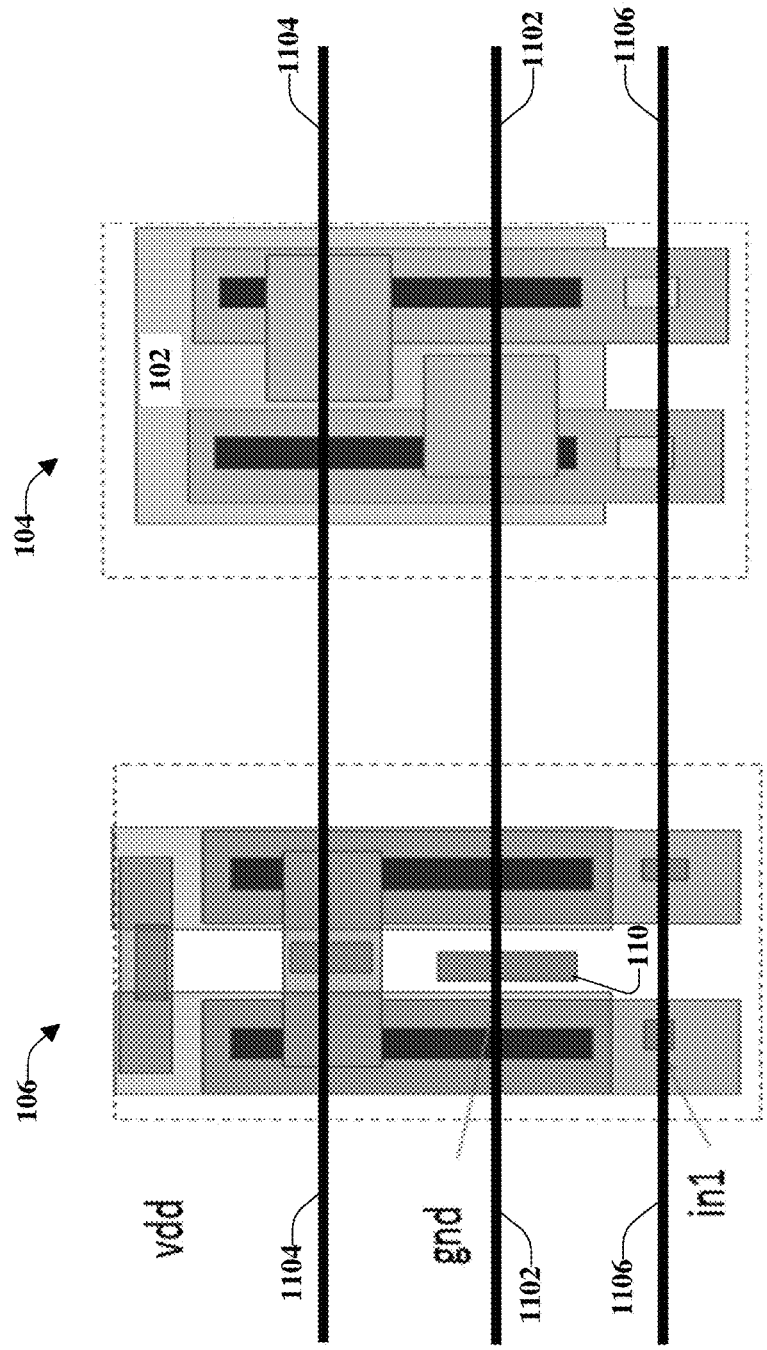
FIG. 11A illustrates a top down view of the second field effect transistor in accordance with one or more embodiments described herein.
FIG. 11B illustrates a top down view of the first field effect transistor in accordance with one or more embodiments described herein.

FIGS. 11A and 11B illustrate a one fin version of the disclosed aspects. Although FIG. 11A illustrates the top-tier (e.g., the second vertical transport field effect transistor 106) and FIG. 11 B illustrates the bottom-tier (e.g., the first vertical transport field effect transistor 104) separated from one another, the devices can be stacked and bonded to one another as discussed herein. A first line 1102 represents a first location across both tiers and the corresponding structure (e.g., the vertical transport field effect transistor structure for three-dimensional monolithic vertical field effect transistor logic gates) at that location, is illustrated in the cross-sectional view of FIG. 12.

The second line 1104 represents a second location across both tiers and the corresponding structure at the second location is illustrated in the cross-sectional view of FIG. 13. As illustrated, a monolithic inter-level via is coming down and going off to contact a different node (as compared to FIG. 12). Thus, a two-fin version cross section 1302 is illustrated. The monolithic inter-level via can be a metallic drain contact, such as tungsten. However, the monolithic inter-level via can be formed of various other metals. Accordingly, there can be a separate drain contact level offset from the active transistor.

Further, a third line 1106 of FIGS. 11A and 11B represents a third location across both tiers, and the corresponding structure at the third location is illustrated in the cross-sectional view of FIG. 14. Accordingly, there can be a separate gate contact level offset from the transistor.

Figure 15:
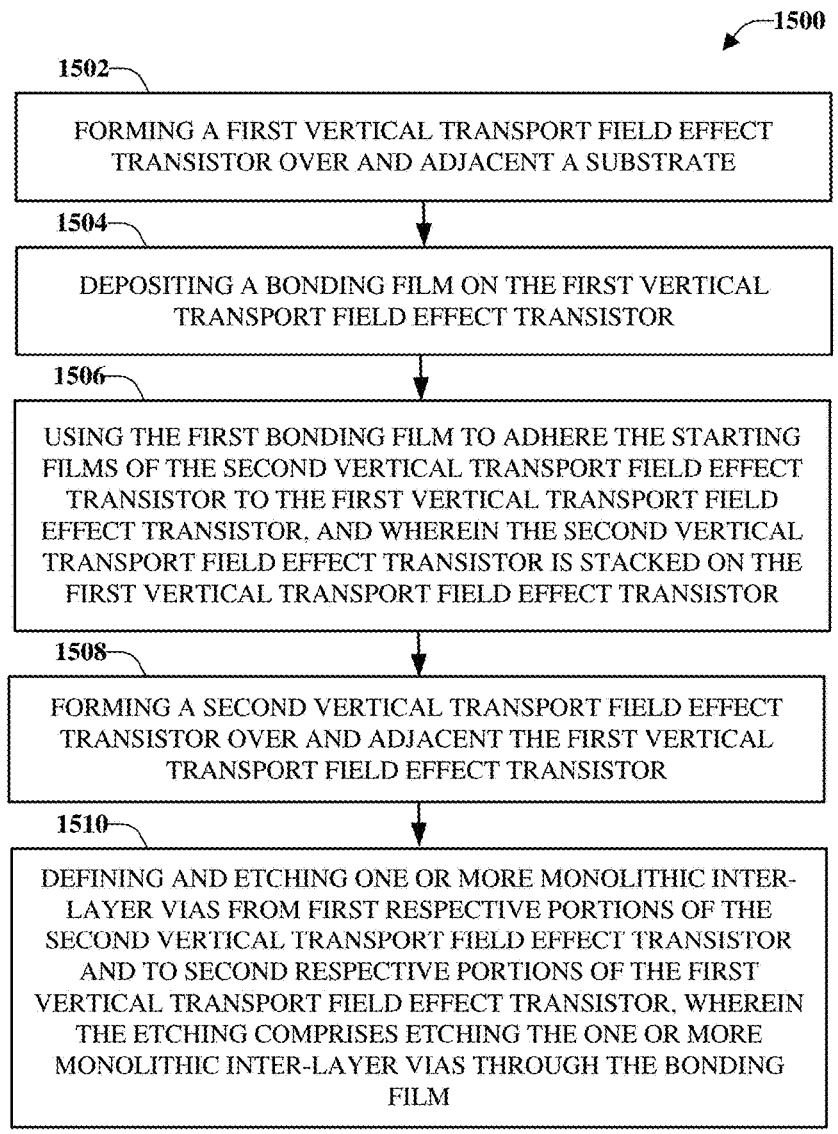
FIG. 15 illustrates a flow diagram of an example, non-limiting method for fabricating three-dimensional monolithic vertical field effect transistor logic gates in accordance with one or more embodiments described herein.

FIG. 15 illustrates a flow diagram of an example, non-limiting method 1500 for fabricating three-dimensional monolithic vertical field effect transistor logic gates in accordance with one or more embodiments described herein. Repetitive description of like elements employed in other embodiments described herein is omitted for sake of brevity.

At 1502, a first vertical transport field effect transistor can be formed over and adjacent a substrate. According to an implementation, the first vertical transport field effect transistor can be a p-channel field effect transistor. According to other implementations, the first vertical transport field effect transistor can be an n-channel field effect transistor.

A bonding film (e.g., the first bonding layer 108a) can be deposited on the first vertical transport field effect transistor, at 1504. The bonding film can be a thin layer film comprising oxide-to-oxide. The bonding film can be configured to affix the first vertical transport field effect transistor to a second vertical transport field effect transistor.

At 1506, the bonding film can be used to adhere the starting films (e.g., the second bonding layer 108b) of the second vertical transport field effect transistor to the first vertical transport field effect transistor. Further, the bonding film and the starting films are not removed to form the second vertical transport field effect transistor (e.g., the second vertical transport field effect transistor can be formed directly on the bonding film).

The second vertical transport field effect transistor can be formed, at 1508. The second vertical transport field effect transistor can be formed over and adjacent the first vertical transport field effect transistor. For example, the second vertical transport field effect transistor can be stacked on the first vertical transport field effect transistor. According to an implementation, the second vertical transport field effect transistor can be an n-channel field effect transistor. According to other implementations, the second vertical transport field effect transistor can be a p-channel field effect transistor.

One or more monolithic inter-layer vias can be defined and etched, at 1510. The one or more monolithic inter-layer vias can extend from first respective portions of the second vertical transport field effect transistor and to second respective portions of the first vertical transport field effect transistor. According to an implementation, etching the one or more monolithic inter-layer vias can comprise etching the one or more monolithic inter-layer vias through the bonding film and the starting films. Accordingly, the bonding film and the starting films are not removed prior to the formation of the one or more monolithic inter-layer vias.

Figure 16:
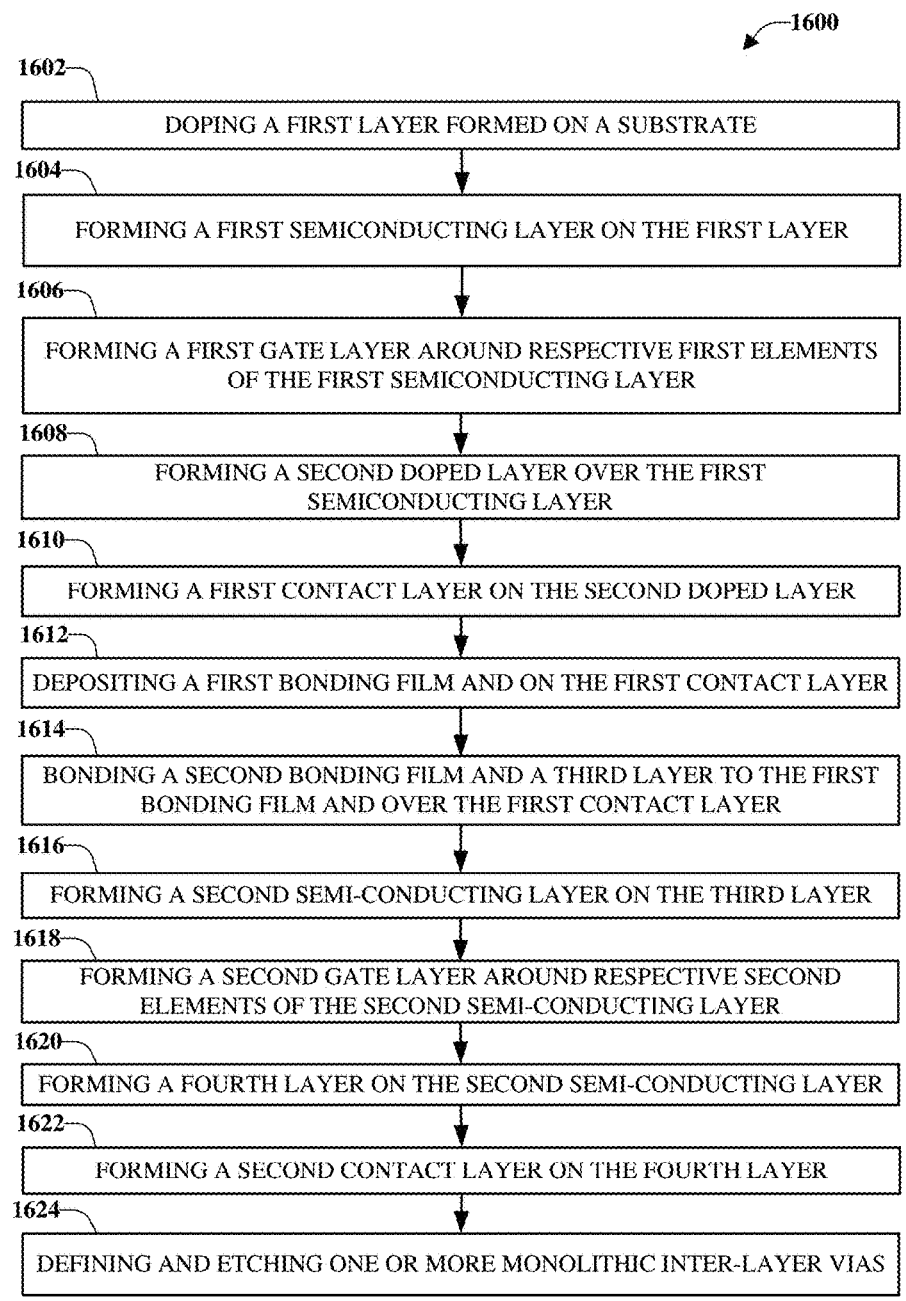
FIG. 16 illustrates a flow diagram of an example, non-limiting method for fabricating, stacking, and bonding a first vertical transport field effect transistor and a second vertical transport field effect transistor in accordance with one or more embodiments described herein.

FIG. 16 illustrates a flow diagram of an example, non-limiting method 1600 for fabricating, stacking, and bonding a first vertical transport field effect transistor and a second vertical transport field effect transistor in accordance with one or more embodiments described herein. Repetitive description of like elements employed in other embodiments described herein is omitted for sake of brevity.

The method 1600 can start, at 1602, with doping a first layer formed on a substrate. At 1604, a first semiconducting layer can be formed on the first layer. The first semiconducting layer can be, for example, a fin structure formed on the first layer.

A first gate layer can be formed, at 1606, around respective first elements of the first semiconducting layer. For example, a first gate of the first gate layer can be formed around a first fin of the first semiconducting layer. Further to this example, a second gate of the first gate layer can be formed around a second fin of the first semiconducting layer. In addition, one or more subsequent gates of the first gate layer can be formed around one or more subsequent fins of the first semiconducting layer.

At 1608, a second doped layer can be formed over the first semiconducting layer. A first contact layer can be formed on the second doped layer, at 1610. On the first contact layer, a first bonding film can be deposited, at 1612.

A second bonding film and a third layer can be bonded, at 1614, to the first bonding film and over the first contact layer. Further, at 1616, a second semi-conducting layer can be formed on the third layer. A second gate layer can be formed, at 1618, around respective second elements of the second semi-conducting layer. A fourth layer can be formed on the second semi-conducting layer, at 1620. Further, at 1622, a second contact layer can be formed on the fourth layer.

At 1624, one or more monolithic inter-layer vias can be defined and etched. For example, the one or more monolithic layers can extend from first respective portions of a second vertical transport field effect transistor (e.g., formed at 1614 to 1622 of FIG. 16) and to second respective portions of a first vertical transport field effect transistor (e.g., formed at 1602 to 1610 of FIG. 16). Etching the one or more monolithic layers can comprise etching the one or more monolithic inter-layer vias through the bonding film.

For simplicity of explanation, the methodologies and/or computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 17:
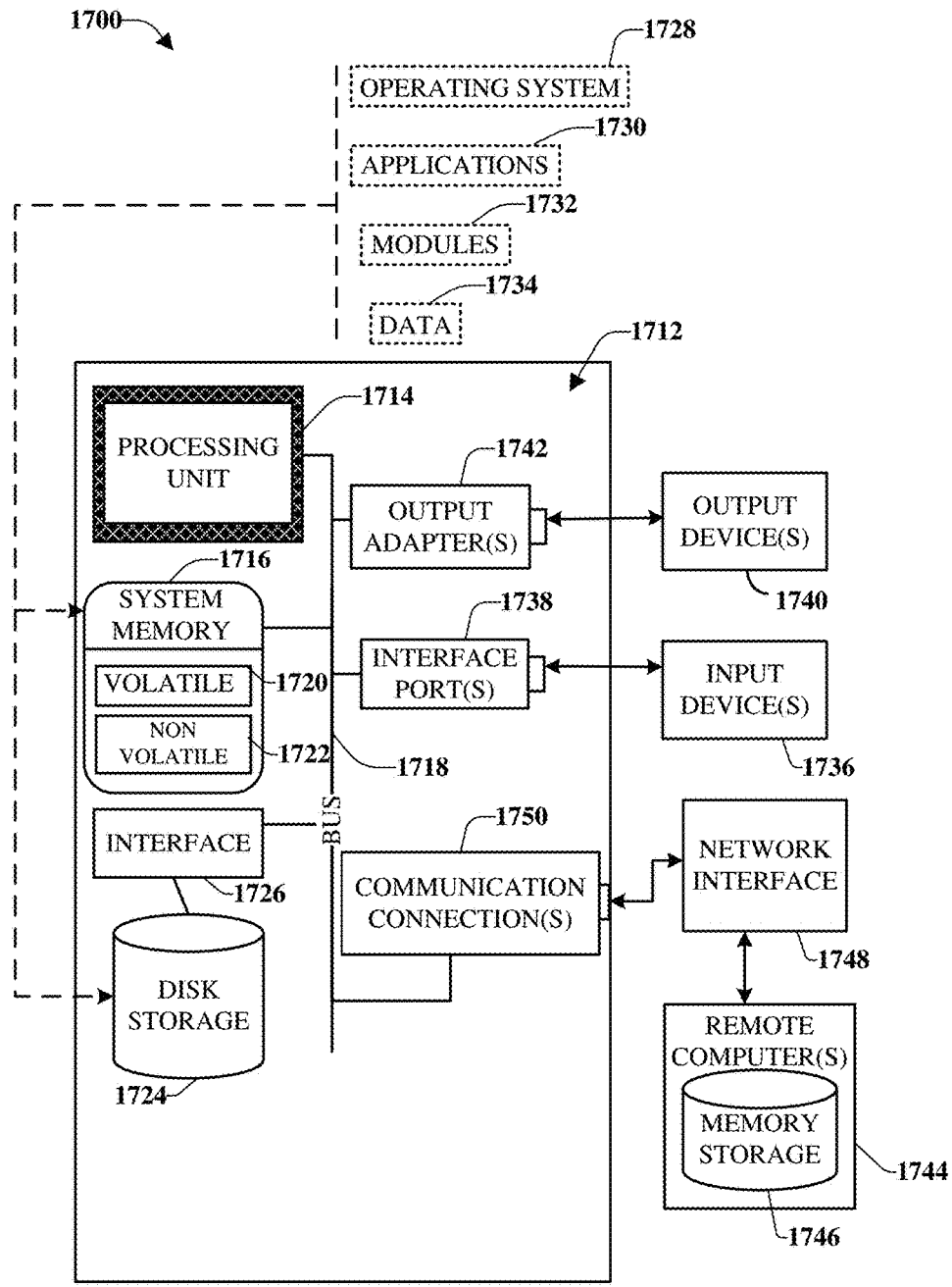
FIG. 17 illustrates a block diagram of an example, non-limiting operating environment in which one or more embodiments described herein can be facilitated.

In order to provide a context for the various aspects of the disclosed subject matter, FIG. 17 as well as the following discussion are intended to provide a general description of a suitable environment in which the various aspects of the disclosed subject matter can be implemented. FIG. 17 illustrates a block diagram of an example, non-limiting operating environment in which one or more embodiments described herein can be facilitated. Repetitive description of like elements employed in other embodiments described herein is omitted for sake of brevity. With reference to FIG. 17, a suitable operating environment 1700 for implementing various aspects of this disclosure can also include a computer 1712. The computer 1712 can also include a processing unit 1714, a system memory 1716, and a system bus 1718. The system bus 1718 couples system components including, but not limited to, the system memory 1716 to the processing unit 1714. The processing unit 1714 can be any of various available processors. Dual microprocessors and other multiprocessor architectures also can be employed as the processing unit 1714. The system bus 1718 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 1716 can also include volatile memory 1720 and nonvolatile memory 1722. The basic input/output system (BIOS), containing the basic routines to transfer information between elements within the computer 1712, such as during start-up, is stored in nonvolatile memory 1722. By way of illustration, and not limitation, nonvolatile memory 1722 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM)). Volatile memory 1720 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1712 can also include removable/non-removable, volatile/non-volatile computer storage media. FIG. 17 illustrates, for example, a disk storage 1724. Disk storage 1724 can also include, but is not limited to, devices like a magnetic disk drive, floppy disk drive, tape drive, Jaz drive, Zip drive, LS-100 drive, flash memory card, or memory stick. The disk storage 1724 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1724 to the system bus 1718, a removable or non-removable interface is typically used, such as interface 1726. FIG. 17 also depicts software that acts as an intermediary between users and the basic computer resources described in the suitable operating environment 1700. Such software can also include, for example, an operating system 1728. Operating system 1728, which can be stored on disk storage 1724, acts to control and allocate resources of the computer 1712. System applications 1730 take advantage of the management of resources by operating system 1728 through program modules 1732 and program data 1734, e.g., stored either in system memory 1716 or on disk storage 1724. It is to be appreciated that this disclosure can be implemented with various operating systems or combinations of operating systems. A user enters commands or information into the computer 1712 through input device(s) 1736. Input devices 1736 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1714 through the system bus 1718 via interface port(s) 1738. Interface port(s) 1738 include, for example, a serial port, a parallel port, a game port, and a universal serial bus (USB). Output device(s) 1740 use some of the same type of ports as input device(s) 1736. Thus, for example, a USB port can be used to provide input to computer 1712, and to output information from computer 1712 to an output device 1740. Output adapter 1742 is provided to illustrate that there are some output devices 1740 like monitors, speakers, and printers, among other output devices 1740, which require special adapters. The output adapters 1742 include, by way of illustration and not limitation, video and sound cards that provide a method of connection between the output device 1740 and the system bus 1718. It should be noted that other devices and/or systems of devices provide both input and output capabilities such as remote computer(s) 1744.

Computer 1712 can operate in a networked environment using logical connections to one or more remote computers, such as remote computer(s) 1744. The remote computer(s) 1744 can be a computer, a server, a router, a network PC, a workstation, a microprocessor based appliance, a peer device or other common network node and the like, and typically can also include many or all of the elements described relative to computer 1712. For purposes of brevity, only a memory storage device 1746 is illustrated with remote computer(s) 1744. Remote computer(s) 1744 is logically connected to computer 1712 through a network interface 1748 and then physically connected via communication connection 1750. Network interface 1748 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1750 refers to the hardware/software employed to connect the network interface 1748 to the system bus 1718. While communication connection 1750 is shown for illustrative clarity inside computer 1712, it can also be external to computer 1712. The hardware/software for connection to the network interface 1748 can also include, for exemplary purposes only, internal and external technologies such as, modems including regular telephone grade modems, cable modems and DSL modems, ISDN adapters, and Ethernet cards.

One or more embodiments may be a system, a method, an apparatus and/or a computer program product at any possible technical detail level of integration. The computer program product can include a computer readable storage medium (or media) having computer readable program instructions thereon for causing a processor to carry out aspects of the one or more embodiments. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create method for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other method to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A logic device, comprising:
a first vertical transport field effect transistor formed over and adjacent a substrate;
a first bonding film deposited over the first vertical transport field effect transistor;
a second vertical transport field effect transistor comprising a second bonding film and stacked on the first vertical transport field effect transistor, wherein the second bonding film affixes the second vertical transport field effect transistor to the first vertical transport field effect transistor; and
one or more monolithic inter-layer vias that extend from first respective portions of the second vertical transport field effect transistor to second respective portions of the first vertical transport field effect transistor and through the first bonding film and the second bonding film.

2. The logic device of claim 1, wherein the first vertical transport field effect transistor is an n-channel field effect transistor and the second vertical transport field effect transistor is a p-channel field effect transistor.

3. The logic device of claim 1, wherein the first vertical transport field effect transistor is a p-channel field effect transistor and the second vertical transport field effect transistor is an n-channel field effect transistor.

4. The logic device of claim 1, wherein the first vertical transport field effect transistor comprises:
a first doped layer formed on the substrate;
a first semiconducting layer formed on the first doped layer;
a first gate layer formed around respective first elements of the first semiconducting layer;
a second doped layer formed over the first semiconducting layer; and
a first contact layer formed on the second doped layer.

5. The logic device of claim 4, wherein the second vertical transport field effect transistor comprises:
a third doped layer placed over the first contact layer and the first bonding film;
a second semi-conducting layer formed on the third doped layer;
a second gate layer formed around respective second elements of the second semi-conducting layer;
a fourth doped layer formed over the second semi-conducting layer; and
a second contact layer formed on the fourth doped layer.

6. The logic device of claim 5, wherein the one or more monolithic inter-layer vias penetrate and contact the second gate layer and extend to the first gate layer.

7. The logic device of claim 5, wherein the one or more monolithic inter-layer vias extend from a first metallurgy on the first vertical transport field effect transistor to a second metallurgy on the second vertical transport field effect transistor.

8. A semiconductor chip, comprising:
a first vertical transport field effect transistor formed over and adjacent a substrate;
a first bonding film deposited on the first vertical transport field effect transistor;
a second vertical transport field effect transistor stacked on the first vertical transport field effect transistor, the second vertical transport field effect transistor comprises a second bonding film, wherein the second bonding film affixes the second vertical transport field effect transistor to the first vertical transport field effect transistor; and
one or more monolithic inter-layer vias that extend from first respective portions of the second vertical transport field effect transistor to second respective portions of the first vertical transport field effect transistor and through the first bonding film and the second bonding film.

9. The semiconductor chip of claim 8, wherein the one or more monolithic inter-layer vias extend from a first metallurgy on the first vertical transport field effect transistor to a second metallurgy on the second vertical transport field effect transistor.

* * * * *